United States Patent
Zhou

(10) Patent No.: US 10,269,927 B2
(45) Date of Patent: Apr. 23, 2019

(54) SEMICONDUCTOR STRUCTURES AND FABRICATION METHODS THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 179 days.

(21) Appl. No.: 15/335,595

(22) Filed: Oct. 27, 2016

(65) Prior Publication Data
US 2017/0133486 A1 May 11, 2017

(30) Foreign Application Priority Data
Nov. 5, 2015 (CN) .......................... 2015 1 0749620

(51) Int. Cl.
*H01L 21/8234* (2006.01)
*H01L 29/66* (2006.01)
(Continued)

(52) U.S. Cl.
CPC ............... *H01L 29/66537* (2013.01); *H01L 21/823412* (2013.01); *H01L 21/823431* (2013.01);
(Continued)

(58) Field of Classification Search
CPC ......... H01L 21/823412; H01L 27/0886; H01L 27/0924; H01L 29/4966; H01L 29/517; H01L 29/66545
See application file for complete search history.

(56) References Cited

U.S. PATENT DOCUMENTS

2011/0248332 A1* 10/2011 Levy .................. C23C 16/0272
257/324
2013/0270619 A1   10/2013 Schloesser et al.
(Continued)

*Primary Examiner* — Joseph Galvin, III
(74) *Attorney, Agent, or Firm* — Anova Law Group, PLLC

(57) ABSTRACT

A method for fabricating a semiconductor structure includes forming a plurality of first fin structures in a core region of a substrate and a plurality of second fin structures in a peripheral region of the substrate, forming a first dummy gate structure including a first dummy gate oxide layer and a first dummy gate electrode layer on each first fin structure and a second dummy gate structure including a second gate oxide layer and a second dummy gate electrode layer on each second fin structure. The method further includes removing each first dummy gate electrode layer, performing an ion implantation process to tune the threshold voltages of the first fin structures, and removing each first dummy gate oxide layer. The method also includes removing each second dummy gate electrode layer, and forming a gate dielectric layer and a metal layer on each first fin structure and each second fin structure.

19 Claims, 6 Drawing Sheets

(51) Int. Cl.
<table>
<tr><td>H01L 21/8238</td><td>(2006.01)</td></tr>
<tr><td>H01L 27/092</td><td>(2006.01)</td></tr>
<tr><td>H01L 29/49</td><td>(2006.01)</td></tr>
<tr><td>H01L 29/51</td><td>(2006.01)</td></tr>
<tr><td>H01L 27/088</td><td>(2006.01)</td></tr>
</table>

(52) U.S. Cl.
CPC ........ *H01L 21/823462* (2013.01); *H01L 21/823807* (2013.01); *H01L 21/823821* (2013.01); *H01L 21/823842* (2013.01); *H01L 21/823857* (2013.01); *H01L 27/0924* (2013.01); *H01L 29/4966* (2013.01); *H01L 29/517* (2013.01); *H01L 29/66545* (2013.01); *H01L 27/0886* (2013.01)

(56) References Cited

U.S. PATENT DOCUMENTS

| | | | |
|---|---|---|---|
| 2014/0227846 A1 | 8/2014 | Liaw | |
| 2014/0319623 A1 | 10/2014 | Tsai | |
| 2015/0206949 A1* | 7/2015 | Zhao | H01L 29/495 257/410 |
| 2015/0243564 A1* | 8/2015 | Zhao | H01L 29/66545 438/591 |
| 2016/0093714 A1* | 3/2016 | Wang | H01L 29/66537 257/48 |

* cited by examiner

SEMICONDUCTOR STRUCTURES AND FABRICATION METHODS THEREOF

CROSS-REFERENCES TO RELATED APPLICATIONS

This application claims the priority of Chinese Patent Application No. CN201510749620.X, filed on Nov. 5, 2015, the entire content of which is incorporated herein by reference.

FIELD OF THE DISCLOSURE

The present disclosure generally relates to the field of semiconductor fabrication technology and, more particularly, relates to semiconductor structures and fabrication methods thereof.

BACKGROUND

In the field of semiconductor fabrication, with very-large-scale integration (VLSI) becoming the development trend, the feature size of integrated circuits steadily decreases. To accommodate the decrease of the feature size, the channel length in metal-oxide-semiconductor field-effect-transistors (MOSFET) also continuously decreases. However, as the channel length of devices becomes shorter, the distance between the source region and the drain region in the devices may also be reduced. Therefore, the gate electrode in traditional planar MOSFETs may not have sufficient ability to control the channel. It becomes more difficult for the gate voltage to pinch off the channel, and thus the subthreshold leakage phenomena, i.e. the short-channel effects (SCE) may easily take place.

In order to better adapt to the decrease of the feature size, semiconductor fabrication technology gradually changes from planar MOSFETs to more efficient three-dimensional (3D) transistors, such as fin field-effect-transistors (Fin-FETs). In a Fin-FET, the gate electrode is able to control an ultra-thin structure (e.g., a fin structure) from the two side surfaces of the ultra-thin structure. Therefore, Fin-FETs demonstrate much better gate-to-channel controllability than planar MOSFETs. As such, Fin-FETs may be able to significantly suppress the short-channel effects. In addition, compared to other devices, Fin-FETs may also demonstrate better compatibility with the existing fabrication technology for integrated circuits.

Fin-FETs may be classified mainly into two categories based on their functions, namely, core devices and peripheral devices (e.g. input/output (I/O) devices). In addition, according to the electrical types of the devices, the core devices may be further categorized into two types: core N-type metal-oxide-semiconductor (NMOS) devices and core P-type metal-oxide-semiconductor (PMOS) devices; and the peripheral devices may be further categorized into two types: peripheral NMOS devices and peripheral PMOS devices.

However, the electrical performance of existing semiconductor structures may still need to be improved. The disclosed semiconductor structures and fabrication methods thereof are directed to solve one or more problems set forth above and other problems in the art.

BRIEF SUMMARY OF THE DISCLOSURE

One aspect of the present disclosure includes a method for fabricating a semiconductor structure. The method for fabricating the semiconductor structure includes forming a plurality of fin structures on a substrate including a core region and a peripheral region. The plurality of fin structures include first fin structures formed in the core region and second fin structures formed in the peripheral region. The method then includes forming a first dummy gate structure including a first dummy gate oxide layer and a first dummy gate electrode layer on each first fin structure and a second dummy gate structure including a second gate oxide layer and a second dummy gate electrode layer on each second fin structure. Further, the method includes forming a dielectric layer on the structure having a top surface leveled with top surfaces of the first dummy gate structures and the second dummy gate structures, removing each first dummy gate electrode layer to expose each first dummy gate oxide layer, performing an ion implantation process on the first fin structures through each first dummy gate oxide layer to tune corresponding threshold voltages, and removing each first dummy gate oxide layer. The method also includes removing each second dummy gate electrode layer to expose each second gate oxide layer, forming a gate dielectric layer on each first fin structure and on each second gate oxide layer, and forming a metal layer to on the gate dielectric layer.

Another aspect of the present disclosure provides a semiconductor structure. The semiconductor structure includes a plurality of fin structures formed on a substrate including a core region and a peripheral region. The plurality of fin structures include first fin structures formed in the core region of the substrate and second fin structures formed in the peripheral region of the substrate. The semiconductor structure also includes a first gate structure formed on a portion of each first fin structure, a second gate structure formed on a portion of each second fin structure, and a dielectric layer formed on the structure having a top surface leveled with top surfaces of the first gate structures and the second gate structures. Further, each first gate structure formed in the core region includes a first gate dielectric layer formed on the first fin structure and a first gate electrode layer formed on the first gate dielectric layer, while each second gate structure formed in the peripheral region includes a second gate oxide layer formed on the second fin structure, a second gate dielectric layer formed on the second gate oxide layer and sidewall surfaces of the dielectric layer, and a second gate electrode layer formed on the second gate dielectric layer. In addition, the first gate dielectric layer and the first gate electrode layer in each first gate structure are consecutively formed on the portion of the first fin structure after removing a first dummy gate electrode layer previously formed on the first fin structure, performing an ion implantation process to tune corresponding threshold voltages, and then removing a first dummy gate oxide layer previously formed between the first fin structure and the first dummy gate electrode layer. The second gate dielectric layer and the second gate electrode layer in each second gate structure are consecutively formed on the second gate oxide layer after removing a second dummy gate electrode layer previously formed on the second gate oxide layer. Moreover, the second dummy gate electrode layer is removed after tuning threshold voltages of the first fin structures by the ion implantation process.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

According to existing fabrication methods and semiconductor structures, the electrical performance of the semiconductor structures may still need to be improved. In the following, examples will be provided to illustrate the reasons that may lead to undesired electrical performance for semiconductor structures fabricated by existing methods.

According to existing fabrication methods, a sacrificial oxide layer is usually formed on the surface of a core-region fin structure of the semiconductor structure before forming a dummy gate oxide layer. The sacrificial oxide layer is used to provide protection for the core-region fin structure during a subsequently-performed ion implantation process. In the meantime, the sacrificial oxide layer may also be used to control the diffusion ability of implanted ions.

Further, an ion implantation process including one or multiple implantation steps is then performed on the fin structures of the devices in the core region to tune the threshold voltages of the subsequently-formed Fin-FETs. Specifically, after the completion of each implantation step, the sacrificial oxide layer may be removed and a new sacrificial oxide layer may then be formed. However, the thermal oxidation process usually performed to form each sacrificial oxide layer may easily lead to loss of ions that have been implanted into the fin structures. Specifically, the implanted ions (dopants) may easily enter the newly-formed sacrificial oxide layer during the thermal oxidation process to form the sacrificial oxide layer, and may then escape from the gaps formed in the sacrificial layer due to expansion of the sacrificial layer during heating. In addition, a thermal oxidation process performed to form the dummy gate oxide layer in existing fabrication methods may also easily let the implanted ions diffuse into the dummy gate oxide layers. The implanted ions may further escape from the gaps formed in the dummy gate oxide layer due to expansion of the dummy gate oxide layer during heating. Therefore, the electrical performance of the devices in the core region may deviate from the desired performance.

Figure 9:
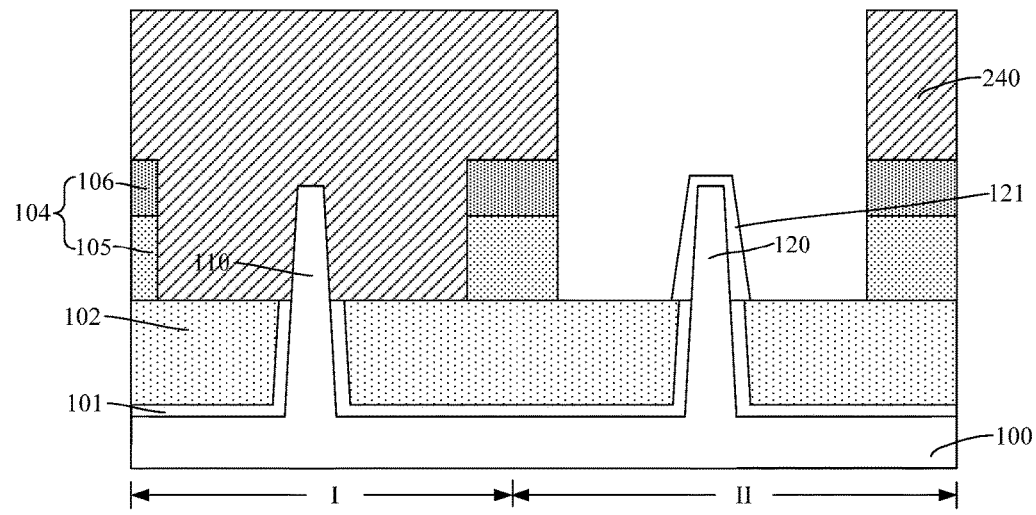
Figure 10:
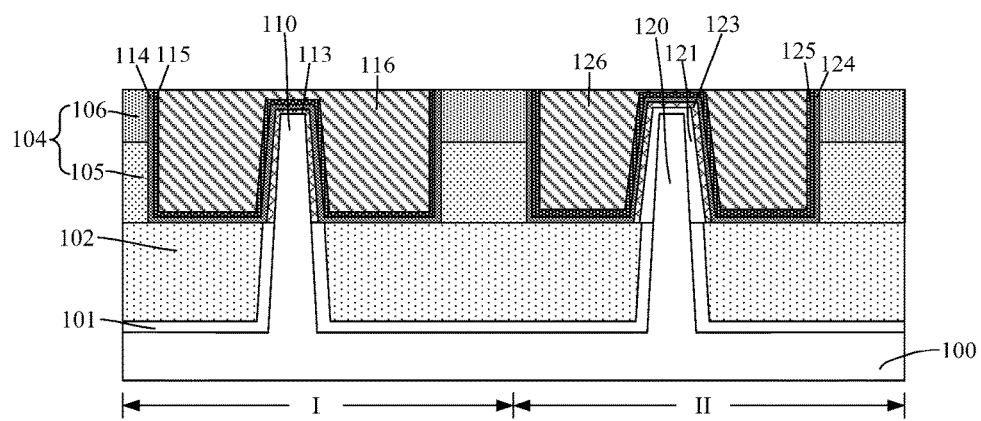
Figure 11:
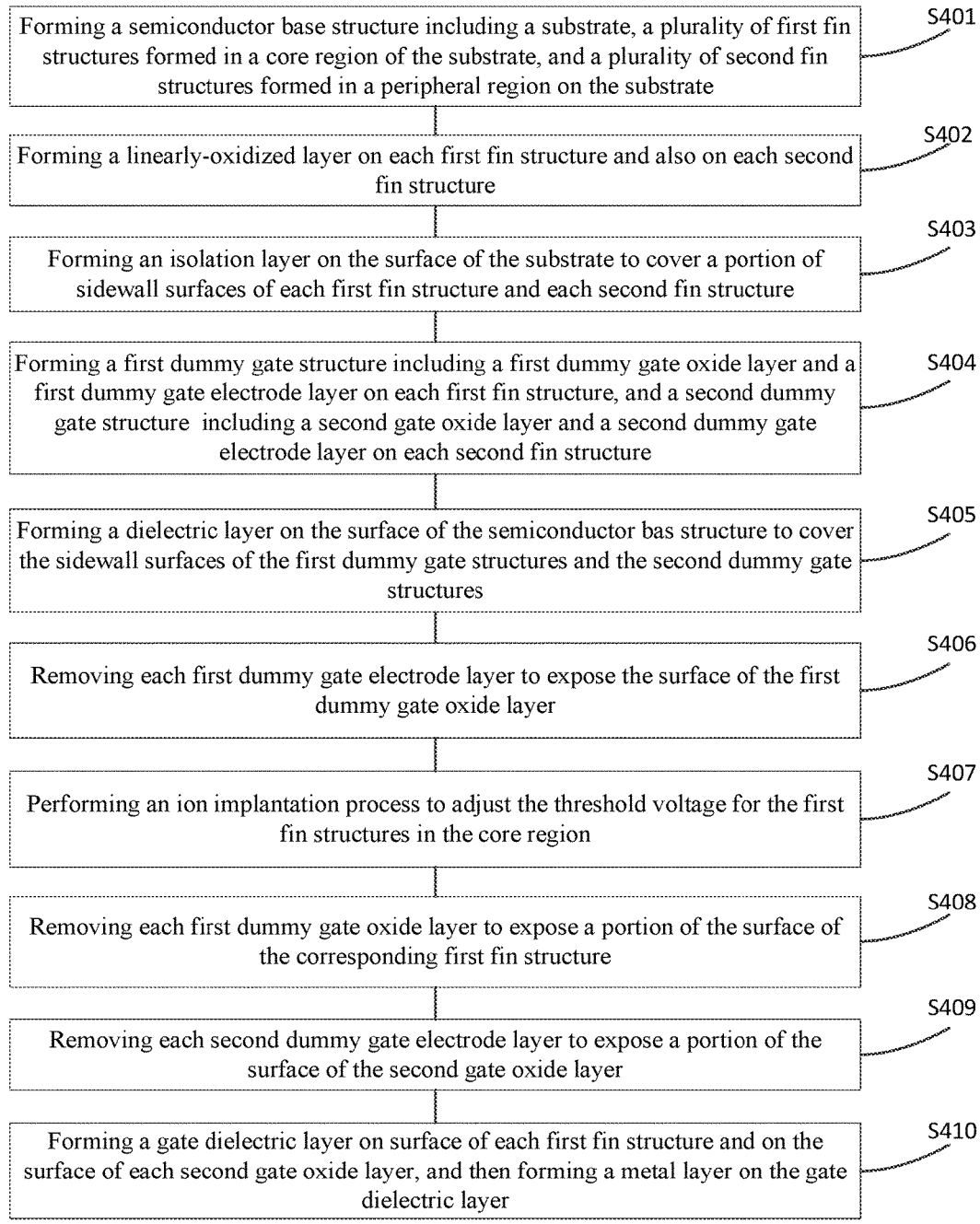
FIG. 11 illustrates a flowchart of an exemplary fabrication process for a semiconductor structure consistent with disclosed embodiments in the present disclosure.

The present disclosure provides a semiconductor structure and a method for fabricating the semiconductor structure to improve the performance of the devices including the semiconductor structure. FIG. 11 shows a flowchart of an exemplary fabrication process consistent with disclosed embodiments. FIGS. 1-10 show schematic cross-section views of semiconductor structures at certain stages of the exemplary fabrication process.

Figure 1:
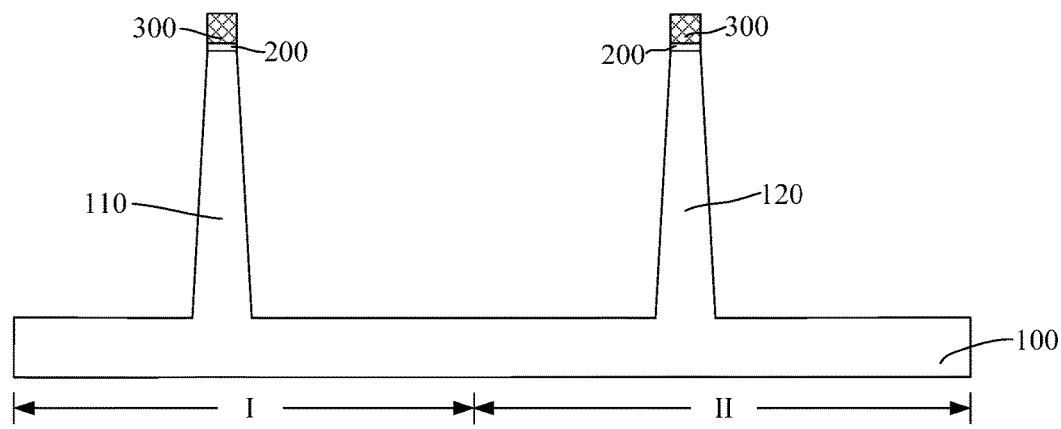
FIGS. 1-10 illustrate schematic cross-section views of semiconductor structures at certain stages of an exemplary fabrication process consistent with disclosed embodiments in the present disclosure.

Referring to FIG. 11, at the beginning of the fabrication process, a semiconductor base structure is formed (S401). FIG. 1 shows a schematic cross-section view of a corresponding semiconductor structure.

Referring to FIG. 1, a semiconductor base structure may be formed. The semiconductor base structure may include a substrate 100 and a plurality of fin structures protruding from the substrate 100. The substrate 100 may include a core region I used to form core devices and a peripheral region II used to form peripheral devices (such as input/output (IO) devices). The plurality of fin structures may be formed in both the core region I and the peripheral region II. Specifically, fin structures formed in the core region I are first fin structures 110 and fin structures formed in the peripheral region II are second fin structures 120. For illustration purposes, FIGS. 1-10 only show one first fin structure 110 formed on the substrate of the core region I and one second fin structure 120 formed on the substrate of the peripheral region II, although the number of the first fin structures 110 formed in the core region I and/or the number of the second fin structures 120 formed in the peripheral region II may be more than one.

The substrate 100 may be made of one of silicon, germanium, SiGe, SiC, GaAs, InAs, etc. The substrate 100 may also be a silicon on insulator (SOI) or germanium on insulator (GOI) substrate. The first fin structure 110 and the second fin structure 120 may be made of one of silicon, germanium, SiGe, SiC, GaAs, InAs, etc. In one embodiment, the substrate 100 is a silicon substrate, and the first fin structure 110 and the second fin structure 120 are also made of silicon.

Moreover, the core region I may include at least one N-type region and/or at least one P-type region, and the peripheral region II may include at least one N-type region and/or at least one P-type region. That is, the core region I and the peripheral region II may include same type and/or different type MOS structures. In one embodiment, MOS structures in the core region I may be the same type as MOS structures in the peripheral region II.

In one embodiment, the semiconductor base structure may be formed by a process including the following steps. First, an initial substrate is provided. A hard mask layer 300 may be formed on the surface of the initial substrate. The position, the shape, and the dimension of the patterns of the hard mask layer 300 may define the position, the shape, and the dimension of the subsequently-formed fin structures. Then, a plurality of bulges may be formed by etching the initial substrate using the mask layer 300 as an etch mask. The bulges formed by the etching process may be the fin structures and the etched initial substrate may become the substrate 100. The substrate may further include a core region I and a peripheral region II. The fin structures formed in the core region I may be the first fin structures 110 and the fin structures formed in the peripheral region II may be the second fin structures 120.

In one embodiment, the top dimension of the first fin structure 110 may be smaller than the bottom dimension of the first fin structure 110, and the top dimension of the second fin structure 120 may be smaller than the bottom dimension of the second fin structure 120. In other embodiments, the sidewalls of the first fin structure may be perpendicular to the surface of the substrate. That is, the top dimension of the first fin structure may be equal to the bottom dimension of the first fin structure. Similarly, the sidewalls of the second fin structure may be perpendicular to the surface of the substrate. That is, the top dimension of the second fin structure may be equal to the bottom dimension of the second fin structure.

The hard mask layer 300 may be made of $SiN_x$. During a subsequent planarization process, the hard mask layer 300 may serve as a stop layer. In addition, the hard mask layer 300 may also provide protection for the top surfaces of the first fin structure 110 and the second fin structure 120 during subsequent fabrication processes.

Further, prior to forming the hard mask layer 300 on the initial substrate, an oxide layer 200 may be formed on the initial substrate. The oxide layer 200 may be used as a buffer layer for the hard mask layer 300 to enhance the adhesion between the hard mask layer 300 and the top surfaces of the first fin structure 110 and the second fin structure 120. In one embodiment, the oxide layer 200 is made of $SiO_x$.

Figure 2:
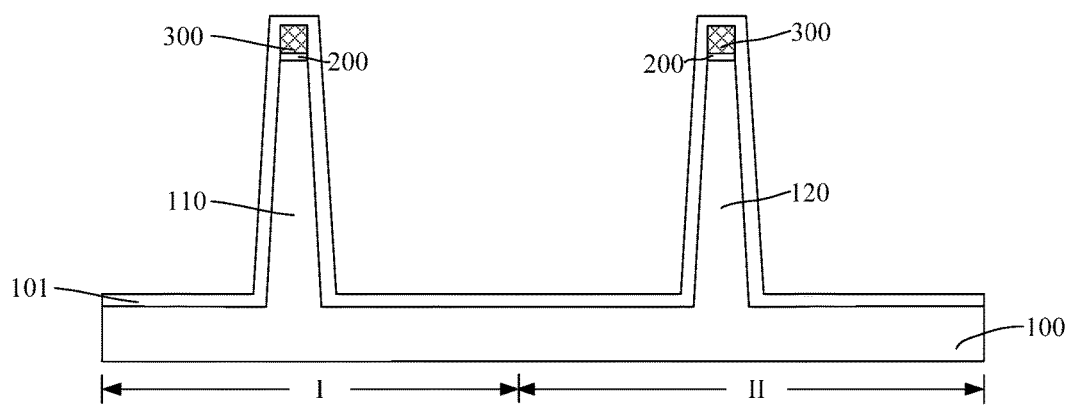

Returning to FIG. 11, further, a linearly-oxidized layer may be formed on the surfaces of the first fin structures and the second fin structures (S402). FIG. 2 shows a schematic cross-section view of a corresponding semiconductor structure.

Referring to FIG. 2, a linearly-oxidized layer 101 may be conformally formed on the first fin structures 110 and the second fin structures 120. The linearly-oxidized layer 101 may be used to recondition the first fin structure 110 and the second fin structure 120.

Because the first fin structures 110 and the second fin structures 120 are formed by etching the initial substrate, the first fin structures 110 and the second fin structures 120 may often have protruding edges and corners. In addition, defects may also exist at the surfaces of the first fin structures 110 and the second fin structures 120. Therefore, the performance of subsequently-formed Fin-FETs may be affected.

In one embodiment, an oxidation treatment process may be performed on the first fin structures 110 and the second fin structures 120 to form the linearly-oxidized layer 101 on each first fin structures 110 and also on each second fin structure 120. Because the protruding edges and corners of the first fin structures 110 and the second fin structures 120 may have a larger specific surface area than structures with flat surfaces, the protruding edges and corners may be easily oxidized during the oxidation treatment process. Therefore, after removing the linearly-oxidized layer 101 in a subsequent process, the defective surface layers of the first fin structures 110 and the second fin structures 120 may be removed; in the meantime, the protruding edges and corners may also be rounded. As such, the surfaces of the first fin structures 110 and the second fin structures 120 may be smoothened, while the lattice quality of the first fin structures 110 and the second fin structures 120 may also be improved. Therefore, point discharge at the top tips of the first fin structures 110 and the second fin structures 120 may be avoided, which may be conducive to improving the performance of the Fin-FETs.

The oxidation treatment process may be an oxygen plasma oxidation process or a solution oxidation process using a mixture of sulfuric acid and hydrogen peroxide. The oxidation treatment process may also oxidize the surface of the substrate 100. Therefore, a linearly-oxidized layer 101 may also be formed at the surface of the substrate 100. In one embodiment, the oxygen treatment process performed on the first fin structures 110 and the second fin structures 120 to form the linearly-oxidized layers 101 may be an in-situ steam generation (ISSG) oxidation process. Accordingly, the linearly-oxidized layers 101 may be made of $SiO_2$.

Figure 3:
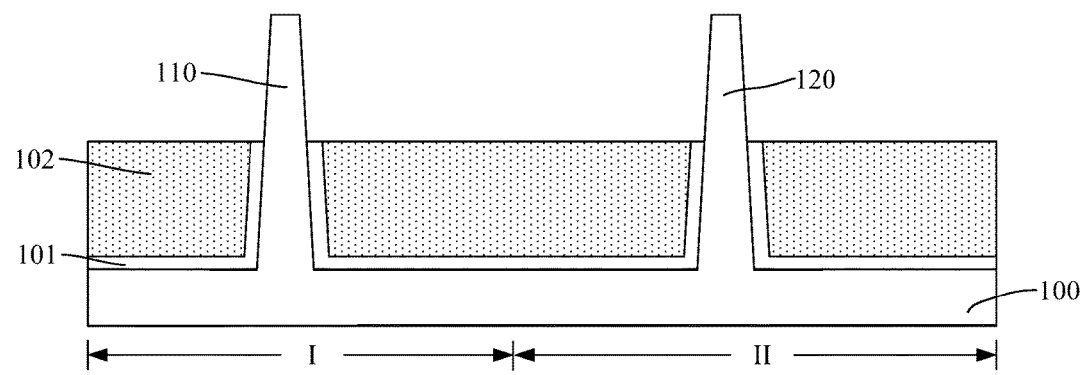

Further, referring to FIG. 11, an isolation layer may be formed on the surface of the substrate (S403). FIG. 3 shows a schematic cross-section view of a corresponding semiconductor structure.

Referring to FIG. 3, an isolation layer 102 may be formed on the surface of the substrate 100. The isolation layer 102 may be used as an isolation structure in the semiconductor structure. Specifically, the isolation layer 102 may be used to electrically isolate adjacent devices. The isolation layer 102 may be made of $SiO_x$, $SiN_x$, SiON, or any appropriate material. In one embodiment, the isolation layer 102 is made of $SiO_x$.

The isolation layer 102 may be formed by a process including the following steps. First, an isolation film may be formed on the surfaces of the linearly-oxidized layers 101. The isolation film may also cover the surface of the hard mask layer 300 (i.e., the top of the isolation film may be higher than the top of the hard mask layer 300). A planarization process may be performed on the isolation film until the surface of the hard mask layer 300 is exposed. Further, the isolation layer 102 may be formed by removing a top portion of the isolation film through an etch-back process. Then, a portion of each linearly-oxidized layer 101 formed above the top surface of the isolation layer 102 (referring to FIG. 2) may be removed, and then the hard mask layer 300 and the oxide layer 200 may also be removed.

The material used to form the isolation film may be different from the materials used for the first fin structures 110, the second fin structures 120, and the substrate 100. Moreover, the isolation layer may be made of a material that can be easily removed such that during the subsequent process to remove the portion of the isolation film, damages to the first fin structures 110 and the second fin structures 120 may be avoided.

The isolation film may be made of one of amorphous silicon, $SiO_x$, SiON, SiC, SiOC, SiCON, etc. The isolation film may be formed by chemical vapor deposition (CVD), physical vapor deposition (PVD), or atomic layer deposition (ALD). In one embodiment, the isolation film is made of $SiO_x$ and formed by a CVD process.

In one embodiment, a chemical mechanical planarization process may be performed to planarize the isolation film until the surface of the mask layer 300 is exposed. Then, the isolation layer 102 may be formed by performing a dry etching process, a wet etching process, or a process combining both dry etching and wet etching to remove a portion of the isolation film.

The ratio between the thickness of the isolation layer 102 and the height of the first fin structures 110 or the second fin structures 120 may be greater than or equal to ¼ but less than or equal to ½. In one embodiment, the ratio between the thickness of the isolation layer 102 and the height of the first fin structures 110 or the second fin structures 120 is ½.

Figure 4:
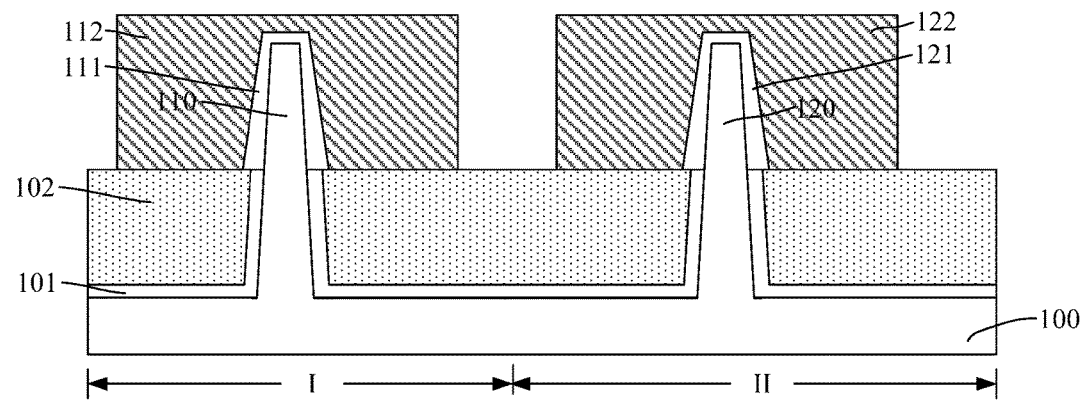

Further, returning to FIG. 11, a first dummy gate structure may be formed on each first fin structure and a second dummy gate structure may be formed on each second fin structure (S404). FIG. 4 shows a schematic cross-section view of a corresponding semiconductor structure.

Referring to FIG. 4, a first dummy gate structure may be formed on the surface of the first fin structure 110 and a second dummy gate structure may be formed on the surface of the second fin structure 120. The first dummy gate structure and the second dummy gate structure may be used to occupy spaces for a subsequently-formed first gate structure and a subsequently-formed second gate structure, respectively.

In one embodiment, the first dummy gate structure is formed across the surface of the first fin structure 110. The first dummy gate structure may cover a portion of the top surface and sidewall surfaces of the first fin structure 110. The first dummy gate structure may include a first dummy gate oxide layer 111 and a first dummy gate electrode layer 112. Moreover, the second dummy gate structure is formed across the surface of the second fin structure 120. The second dummy gate structure may cover a portion of the top surface and sidewall surfaces of the second fin structure 120.

The second dummy gate structure may include a second gate oxide layer 121 and a second dummy gate electrode layer 122.

The first dummy gate oxide layer 111 and the second gate oxide layer 121 may be made of $SiO_x$. The first dummy gate electrode layer 112 and the second dummy gate electrode layer 122 may be made of polycrystalline silicon, $SiO_x$, $SiN_x$, SiON, SiCN, SiCON, or amorphous silicon. In one embodiment, the first dummy gate electrode layer 112 and the second dummy gate electrode layer 122 are both made of polycrystalline silicon.

Specifically, the first dummy gate structure and the second dummy gate structure may be formed by a process including the following steps.

First, a dummy gate oxide film may be formed on the surfaces of the first fin structures 110 and the second fin structures 120. The dummy gate oxide film may also cover the surface of the isolation layer 102. A first patterned layer may be formed to cover the portion of the dummy gate oxide film formed on the first fin structures 110 and the second fin structures 120. An etching process may then be performed by using the first patterned layer as an etch mask to remove the exposed portion of the dummy gate oxide film formed on the isolation layer 102. After the etching process, a first dummy gate oxide layer 111 may be formed on the surface of each first fin structures 110 while a second gate oxide layer 121 may be formed on the surface of each second fin structure 120.

Further, after removing the first patterned layer, a dummy gate electrode film may be formed on the surfaces of the first dummy gate oxide layer 111 and the second gate oxide layer 121. The dummy gate electrode film may also be formed on the surface of the isolation layer 102. A second patterned layer may be formed on the surface of the dummy gate electrode film. The position, the shape, and the dimension of the second patterned layer may define the position, the shape, and the dimension for subsequently-formed dummy gate electrode layers. An etching process may then be performed using the second patterned layer as an etch mask to etch the dummy gate electrode film. After the etching process, a first dummy gate electrode 112 may be formed on the surface of each first dummy gate oxide layer 111 and a portion of the isolation layer 102 in the core region I while a second dummy gate electrode layer 122 may be formed on the surface of each second gate oxide layer 112 and a portion of the isolation layer 102 in the peripheral region II. As such, a first dummy gate structure including a first dummy gate oxide layer 111 and a first dummy gate electrode layer 112 may be formed in the core region I while a second dummy gate structure including a second gate oxide layer 121 and a second dummy gate electrode layer 122 may be formed in the peripheral region II. Finally, after forming the first dummy gate structure and the second dummy gate structure, the second patterned layer may be removed.

In one embodiment, both the first patterned layer and the second patterned layer may be hard mask layers. The first patterned layer and the second patterned layer may be made of $SiN_x$.

In another embodiment, the first dummy gate structure and the second dummy gate structure may also be formed by a process including the following steps. First, a dummy gate oxide film may be formed on the surfaces of the first fin structure 110 and the second fin structure 120. The dummy gate oxide film may also cover the surface of the isolation layer 102. A dummy gate electrode film may then be formed on the surface of the dummy gate oxide film, and a third patterned layer may be formed on the surface of the dummy gate electrode film. The position, the shape, and the dimension of the third patterned layer may define the position, the shape, and the dimension for subsequently-formed dummy gate electrode layers.

Further, an etching process may be performed using the third patterned layer as an etch mask to sequentially etch the dummy gate electrode film and the dummy gate oxide film. After the etching process, a first dummy gate structure may be formed on the surface of each first fin structure 110 in the core region I and a second dummy gate structure may be formed on the surface of each second fin structure 120 in the peripheral region II. Specifically, the first dummy gate structure may include a first dummy gate oxide layer 111 and a first dummy gate electrode layer 112 while the second dummy gate structure may include a second gate oxide layer 121 and a second dummy gate electrode layer 122. Finally, after forming the first dummy gate structure and the second dummy gate structure, the third patterned layer may be removed.

In one embodiment, the first dummy gate oxide layer 111 and the second gate oxide layer 121 may be formed by a thermal oxidization process.

Specifically, the first dummy gate oxide layer 111 and the second gate oxide layer 121 may be formed by an ISSG oxidation process. The process parameters used in the ISSG oxidation process may include a process gas including $O_2$ and $H_2$, a flow rate of $O_2$ in a range of 1 sccm to 30 sccm, a flow rate of $H_2$ in a range of 1.5 sccm to 15 sccm, and a chamber temperature in a range of 700° C. to 1200° C.

Moreover, in one embodiment, after forming the first dummy gate structure on the surface of each first fin structure 110 and the second dummy gate structure on the surface of each second fin structure 120, the fabrication process may further include forming a core-region stress layer (not shown) in the first fin structure 110 on each side of the first dummy gate structure, forming a peripheral-region stress layer (not shown) in the second fin structure 120 on each side of the second dummy gate structure, forming a core-region source/drain region (not shown) in each core-region stress layer, and forming a peripheral-region source/drain region (not shown) in each peripheral-region stress layer.

Figure 5:
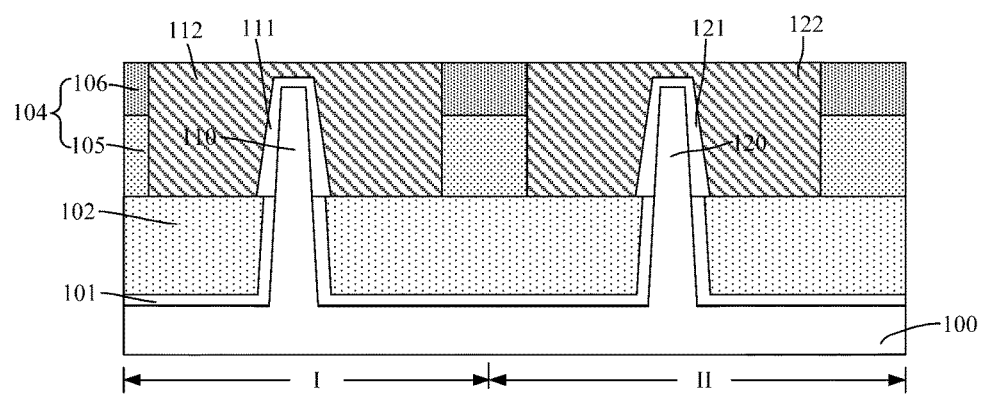

Further, returning to FIG. 11, a dielectric layer may be formed on the surface of the semiconductor base structure (S405). FIG. 5 shows a schematic cross-section view of a corresponding semiconductor structure.

Referring to FIG. 5, a dielectric layer 104 may be formed on the surface of the structure shown in FIG. 4. The dielectric layer 104 may cover the sidewall surfaces of the first dummy gate structures and the second dummy gate structures.

In one embodiment, the dielectric layer 104 may be formed on the surface of the isolation layer 102, a portion of the surface of each first fin structure 110, and a portion of the surface of each second fin structure 120. The dielectric layer 104 may also cover the core-region source/drain regions and the peripheral-region source/drain regions. Moreover, the top surface of the dielectric layer 104 may be leveled with the top surfaces of the first dummy gate electrode layers 112 and the second dummy gate electrode layers 122.

In one embodiment, the dielectric layer 104 may have a multiple-layer structure. Specifically, the dielectric layer 104 may include a first dielectric layer 105 formed on the surface of the isolation layer 102 and a second dielectric layer 106 formed on the surface of the first dielectric layer 105.

In one embodiment, the second dielectric layer 106 is made of $SiO_x$. The density of the second dielectric layer 106 may be larger than the density of the first dielectric layer

105. As compared to the first dielectric layer 105, the second dielectric layer 106 may demonstrate better electrical insulation property so that the subsequently-formed isolation structures may also demonstrate desirable electrical insulating property.

In one embodiment, prior to forming the dielectric layer 104, an etch stop layer (not shown) may be formed on the surface of the isolation layer 102. The etch stop layer may also cover the surfaces of the first fin structures 110, the second fin structures 120, the first dummy gate structures, and the second dummy gate structures.

The etch stop layer may be used to indicate a process stop position for a subsequently-performed planarization process. In one embodiment, the etch stop layer may be made of $SiN_x$.

In one embodiment, the dielectric layer 104 may be formed by a process including the following steps. First, after forming the optional etch stop layer on the surface of the isolation layer 102, a first dielectric film may be formed over the surface of the entire structure. The first dielectric film may cover the first dummy gate structures and the second dummy gate structures. The top surface of the first dielectric film may be higher than the top surfaces of the first dummy gate electrode layer 112 and the second dummy gate electrode layer 122. A planarization process may then be performed on the first dielectric film until the top surface of the etch stop layer is exposed. An etch-back process may then be performed to remove a portion of the first dielectric film, and thus form the first dielectric layer 105. A second dielectric film may then be formed on the surface of the first dielectric layer 105. The second dielectric film may also cover the surfaces of the first dummy gate structures and the second dummy gate structures. The top surface of the second dielectric film may be higher than the top surfaces of the first dummy gate electrode layers 112 and the second dummy gate electrode layers 122. A planarization process may then be performed on the second dielectric film until the top surfaces of the first dummy gate electrode layers 112 and the second dummy gate electrode layers 122 are exposed. As such, the second dielectric layer 106 may be formed.

The openings to be filled by the first dielectric film may include a plurality of openings formed between neighboring fin structures on the substrate 100. In one embodiment, the aspect ratio of the openings to be filled by the first dielectric film may be large. In order to improve the gap-filling ability of the first dielectric film, a flowable chemical vapor deposition (FCVD) process may be adapted to form the first dielectric film. As such, the subsequently-formed first dielectric layer 105 may demonstrate desired adhesion, while the subsequently-formed first dielectric layer 105 may not be porous. In addition, in order to improve the density of the second dielectric film, in one embodiment, a high aspect ratio process (HARP) may be adapted to form the second dielectric film.

The first dielectric layer 105 may be used as an isolation structure to separate the subsequently-formed Fin-FETs. The first dielectric layer 105 may be made of an insulating material such as $SiO_x$, $SiN_x$, SiON, SiOC, SiCN, SiCON, etc. In one embodiment, the first dielectric layer 105 is made of $SiO_x$.

The second dielectric layer 106 may be used as an isolation structure to separate the subsequently-formed Fin-FETs. The second dielectric layer 106 may also be made of an insulating material such as $SiO_x$, $SiN_x$, SiON, SiOC, SiCN, SiCON, etc. In one embodiment, the second dielectric layer 106 is made of $SiO_x$.

In one embodiment, a chemical mechanical polishing (CMP) process may be performed on the first dielectric film to remove the portion of the first dielectric film formed on the top surface of the etch stop layer. In addition, the portion of the second dielectric film formed above the top surfaces of the first dummy gate electrode layers 112 and the second dummy gate electrode layers 122 may also be removed by a CMP process. The etch-back process performed to remove the portion of the first dielectric film may be a dry etching process, a wet etching process, or a process combining both dry etching and wet etching.

Further, during the planarization process performed on the second dielectric film, a portion of the etch stop layer formed on the top surfaces of the first dummy gate electrode layers 112 and the second dummy gate electrode layers 122 may also be removed. Therefore, the top surfaces of the second dielectric layer 106, the first dummy gate electrode layers 112, and the second dummy gate electrode layers 122 may be leveled with each other.

Figure 6:
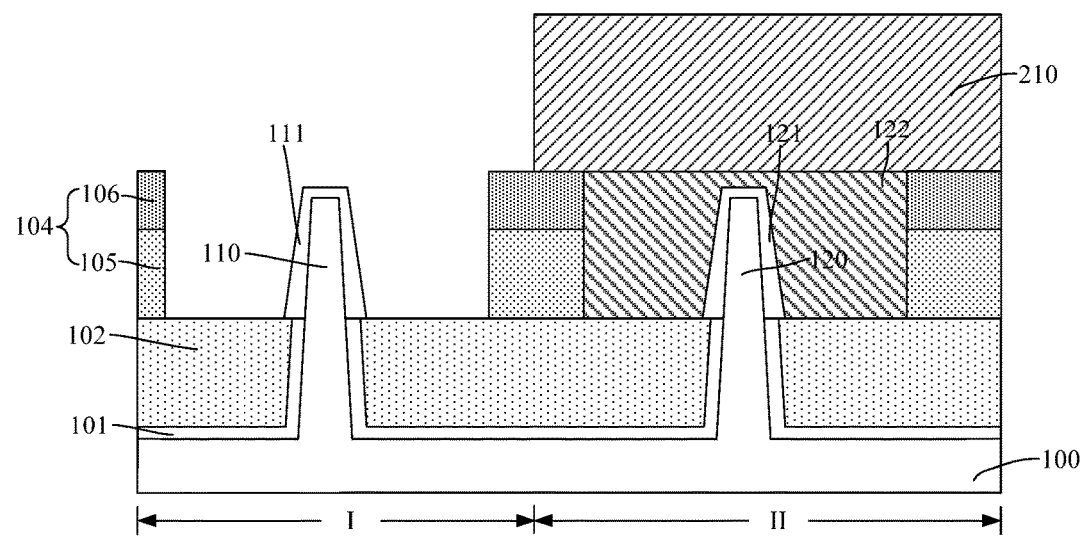

Further, referring to FIG. 11, each first dummy gate electrode layer may be removed to expose the surface of the first dummy gate oxide layer (S406). FIG. 6 shows a schematic cross-section view of a corresponding semiconductor structure.

Referring to FIG. 6, each first dummy gate electrode layer 112 (referring to FIG. 5) may be removed to expose the surface of the first dummy gate oxide layer 111.

Specifically, the first dummy gate electrode layer 112 may be removed by a process including the following steps. First, a photoresist layer 210 may be formed on the surface of the semiconductor base structure. The photoresist layer 210 may be situated in the peripheral region II. The photoresist layer 210 may cover the second dummy gate electrode layer 122 and expose the surface of the first dummy gate electrode layer 112. An etching process may then be performed on the first dummy gate electrode layer 112 using the photoresist layer 210 as an etch mask until the surface of the first dummy gate oxide layer 111 is exposed. Finally, the photoresist layer 210 may be removed.

In one embodiment, the first dummy gate electrode layer 112 may be removed by a dry etching process. Because the etching process may demonstrate a large etch selectivity ratio between the etch rate on the first dummy gate electrode layer 112 and the etch rate on the first dummy gate oxide layer 111. Therefore, the etching process may be able to effectively remove the first dummy gate electrode layer 112 while the first dummy gate oxide layer 111 may not be consumed. After removing the first dummy gate electrode layer 112, the photoresist layer 210 may then be removed by a wet etching process or an ashing process.

Figure 7:
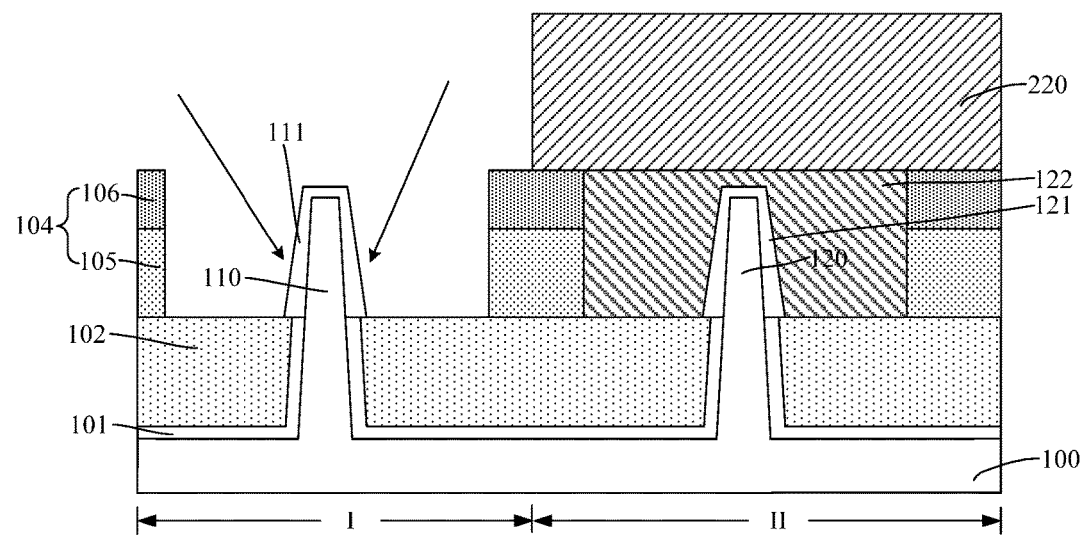

Further, returning to FIG. 11, after removing the first dummy gate electrode layer, an ion implantation process may be performed to implant ions into each first fin structure to tune the threshold voltage of the device formed in the core region (S407). FIG. 7 shows a schematic cross-section view of a corresponding semiconductor structure.

Referring to FIG. 7, the first dummy gate electrode layer 112 (referring to FIG. 5) may be removed. Then, an ion implantation process may be performed to implant ions into each first fin structure 110 through the first dummy gate oxide layer 111 in order to tune the threshold voltage of the devices formed in the core region I.

The core region I may include at least one N-type region and/or at least one P-type region. Accordingly, the devices formed in the core region I may include N-type devices and/or P-type devices.

In one embodiment, the core region I of the semiconductor structure may include both N-type device(s) and P-type device(s). Further, the N-type devices in the core region I may have two distinct concentrations of N-type dopants and the P-type devices in the core region I may also have two distinct concentrations of P-type dopants. Specifically, the first fin structures 110 in the semiconductor structure may include a number of first N-type fin structures, a number of second N-type fin structures, a number of first P-type fin structures, and a number of second P-type fin structures formed on a same first fin structure or sometimes formed on different first fin structures. In addition, the dopant concentration in the first N-type fin structures may be different from the dopant concentration in the second N-type fin structures; and the dopant concentration in the first P-type fin structures may be different from the dopant concentration in the second P-type fin structures. Accordingly, the process to implant ions into the plurality of first fin structures 110 in order to tune the threshold voltages may include the following four implantation steps.

First, a first N-type ion implantation to tune the threshold voltages of the first N-type fin structures may be performed, and then a second N-type ion implantation to tune the threshold voltages of the second N-type fin structures may be performed. The dosage of the ions implanted into the second N-type fin structures to tune the threshold voltages during the second N-type ion implantation may be different from the dosage of the ions implanted into the first N-type fin structures to tune the threshold voltages during the first N-type ion implantation process. Further, a first P-type ion implantation process to tune the threshold voltages of the first P-type fin structures may be performed and then a second P-type ion implantation process to tune the threshold voltages of the second P-type fin structures may be performed. The dosage of the ions implanted into the second P-type fin structures to tune the threshold voltages during the second P-type ion implantation process may be different from the dosage of the ions implanted into the first P-type fin structures to tune the threshold voltages during the first P-type ion implantation process.

Specifically, referring to FIG. 7, the first N-type ion implantation process to tune the threshold voltages for the first N-type fin structures may further include the following steps. First, a first patterned layer 220 may be formed in the peripheral region II. The first patterned layer 220 may also cover the second N-type fin structures (not shown), the first P-type fin structures (not shown), and the second P-type fin structures (not shown) in the core region I. The first patterned layer 220 may expose the surfaces of the first N-type fin structures. A first N-type ion implantation process may then be performed to implant ions into the first N-type fin structures. Further, the first patterned layer 220 may be removed by a wet etching process or an ashing process.

Similarly, the second N-type ion implantation process to tune the threshold voltages for the second N-type fin structures may include the following steps. First, a second patterned layer (not shown) may be formed in the peripheral region II. The second patterned layer may also cover the first N-type fin structures, the first P-type fin structures, and the second P-type fin structures in the core region I. The second patterned layer may expose the surfaces of the second N-type fin structures. A second N-type ion implantation process may then be performed to implant ions into the second N-type fin structures. Further, the second patterned layer may be removed by a wet etching process or an ashing process.

In addition, the first P-type ion implantation process to tune the threshold voltages for the first P-type fin structures may further include the following steps. First, a third patterned layer (not shown) may be formed in the peripheral region II. The third patterned layer may also cover the first N-type fin structures, the second N-type fin structures, and the second P-type fin structures in the core region I. The third patterned layer may expose the surfaces of the first P-type fin structures. A first P-type ion implantation process may then be performed to implant ions into the first P-type fin structures. Further, the third patterned layer may be removed by a wet etching process or an ashing process.

Similarly, the second P-type ion implantation process to tune the threshold voltages for the second P-type fin structures may include the following steps. First, a fourth patterned layer (not shown) may be formed in the peripheral region II. The fourth patterned layer may also cover the first N-type fin structures, the second N-type fin structures, and the first P-type fin structures in the core region I. The fourth patterned layer may expose the surfaces of the second P-type fin structures. A second P-type ion implantation process may then be performed to implant ions into the second P-type fin structures. Further, the fourth patterned layer may be removed by a wet etching process or an ashing process.

In one embodiment, ions implanted into the first fin structures 110 to tune the threshold voltages may be N-type ions and/or P-type ions. When the ions implanted into the first fin structures 110 are N-type ions, the N-type ions may be arsenic ions, the energy of the implanted ions may be in a range of 5 keV to 12 keV, and the dosage of the implanted ions may be in a range of 1E12 atom/cm$^2$ to 5E13 atom/cm$^2$. When the ions implanted into the first fin structures 110 are P-type ions, the P-type ions may be $BF_2^+$ ions, the energy of the implanted ions may be in a range of 3 keV to 10 keV, and the dosage of the implanted ions may be in a range of 5E12 atom/cm$^2$ to 5E13 atom/cm$^2$.

In other embodiments, the ion implantation process to tune the threshold voltages for the first fin structures may be selected based on the actual process demands. That is, the ion implantation process described above may be modified and repeated according to the actual needs of the semiconductor device. For example, the N-type first fin structures in the core region I may have three distinct dopant concentrations, and thus three ion implantation steps may be required to tune the threshold voltages for the N-type first fin structures in the core region I; the P-type first fin structures in the core region I may also have three distinct dopant concentrations, and thus three ion implantation steps may be required to tune the threshold voltages for the P-type first fin structures in the core region I.

Moreover, the first dummy gate oxide layer 111 and the second gate oxide layer 121 are usually formed by a thermal oxidation process, which may easily lead to loss of ions. However, because the ion implantation process to tune threshold voltages for the first fin structures 110 may be formed after the formation of the first dummy gate oxide layer 111 and the second gate oxide layer 112 by the thermal oxidation process, the loss of the implanted ions caused by the thermal oxidation process may then be avoided, which may further ensure the stability of the electrical performance of the devices formed in the core region.

Figure 8:
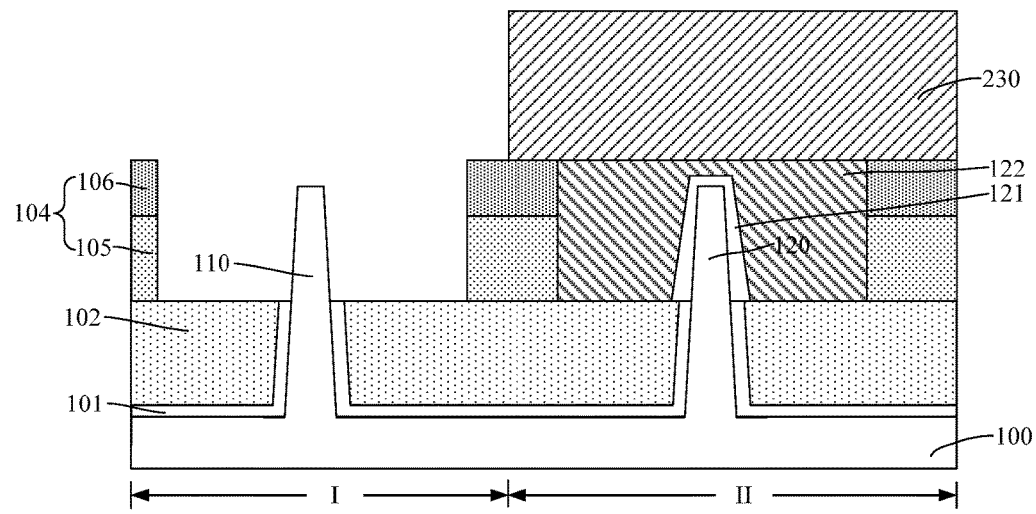

Further, returning to FIG. 11, each first dummy gate oxide layer may be removed to expose a portion of the surface of the corresponding first fin structure (S408). FIG. 8 shows a schematic cross-section view of a corresponding semiconductor structure.

Referring to FIG. 8, each first dummy gate oxide layer 111 (referring to FIG. 7) may be removed to expose a portion of the surface of the corresponding first fin structure 110.

In one embodiment, the operation power voltage of the devices in the core region I may be smaller than the operation power voltage of the devices in the peripheral region II. In order to prevent the electrical breakdown problem and other issues, when the operation power voltage of the device becomes larger, the thickness of the gate dielectric layer in the device may also be larger. That is, the thickness of the subsequently formed gate dielectric layer in the core region I may be smaller than the thickness of the gate dielectric layer in the peripheral region II. In one embodiment, in order to ensure the thickness of the gate dielectric layer in the core region I smaller than the thickness of the gate dielectric layer in the peripheral region II, the first dummy gate oxide layer 111 may be removed before forming the gate dielectric layer in the core region I.

Specifically, the first dummy gate oxide layer may be removed by a process including the following steps. First, a fifth patterned layer 230 may be formed on the surface of the semiconductor base structure. The fifth patterned layer 230 may cover the second dummy gate electrode layer 122 and the portion of the second dielectric layer 106 formed in the peripheral region II. The fifth patterned layer 230 may expose the surface of the first dummy gate oxide layer 111. Further, an etching process using the fifth patterned layer 230 as an etch mask may be performed to remove the first dummy gate oxide layer 111 until the surface of each first fin structure 110 is exposed. Finally, the fifth patterned layer 230 may be removed.

In one embodiment, the first dummy gate oxide layer 111 may be removed by a dry etching process. The fifth patterned layer 230 may be made of a photoresist material. After removing the first dummy gate oxide layer 111, the fifth patterned layer 230 may be removed by a wet etching process or an ashing process.

Further, returning to FIG. 11, after removing the first dummy gate oxide layer, the second dummy gate electrode layer may be removed to expose the second gate oxide layer (S409). FIG. 9 shows a schematic cross-section view of a corresponding semiconductor structure.

Referring to FIG. 9, after removing the first dummy gate oxide layer 111 (referring to FIG. 7), the second dummy gate electrode layer 122 (referring to FIG. 8) may be removed to expose the surface of the second gate oxide layer 121.

Specifically, the second dummy gate electrode layer 122 may be removed by a process including the following steps. First, a deep ultraviolet (UV)-light-absorbing oxide (DUO) layer 240 may be formed on the surface of the semiconductor base structure. The DUO layer 240 may cover the surface of each first fin structure 110 and expose the surface of each second dummy gate electrode layer 122. Further, an etching process using the DUO layer 240 as an etch mask may be performed to remove the second dummy gate electrode layer 122 until the surface of the second gate oxide layer 121 is exposed. Finally, the DUO layer 240 may be removed.

In one embodiment, the second dummy gate electrode layer 122 may be removed by a dry etching process. The DUO layer 240 may have desired filling ability to sufficiently cover each first fin structure 110. After removing the second dummy gate electrode layer 122, the DUO layer 240 may be removed by a wet etching process or an ashing process.

In one embodiment, the ion implantation process to tune the threshold voltages for the first fin structures 110 may include four steps: a first N-type ion implantation process to tune the threshold voltages for the first N-type fin structure, a second N-type ion implantation process to tune the threshold voltages for the second N-type fin structure, a first P-type ion implantation process to tune the threshold voltages for the first P-type fin structure, and a second P-type ion implantation process to tune the threshold voltages for the second P-type fin structure. Accordingly, four removal processes may be required to remove the four patterned layers used in the four implantation steps. Therefore, the second dummy gate electrode layer 122 may be removed after implanting ions into all first fin structures 110 to tune the threshold voltages. During the ion implantation process to tune the threshold voltages for the first fin structures 110, the second dummy gate electrode layer 122 may provide protection for the surfaces of the corresponding second fin structure 120 and the corresponding second gate oxide layer 121. Specifically, the etching process to remove each of the four patterned layers may not consume the second gate oxide layer 121, and thus the stability of the electrical performance of the devices in the peripheral region II may be ensured.

Further, returning to FIG. 11, a gate dielectric layer may be formed on the surface of each first fin structure and also on the surface of each second gate oxide layer 121, and a metal layer may then be formed on the gate dielectric layer (S410). FIG. 10 shows a schematic cross-section view of a corresponding semiconductor structure.

Referring to FIG. 10, a gate dielectric layer (not shown) may be formed on the surface of each first fin structure 110 and also on the surface of the second gate oxide layer 121 on each of the second fin structure 120. Then, a metal layer (not shown) may be formed on the gate dielectric layer. The portion of the gate dielectric layer and the portion of the metal layer situated on each first fin structure 110 in the core region I may form a first gate structure and the portion of the second gate oxide layer 121 together with the portion of the gate dielectric layer and the portion of the metal layer situated on each second fin structure 120 may form a second gate structure.

In one embodiment, the first gate structure may be formed across the corresponding first fin structure 110 and may cover a portion of the top and the sidewall surfaces of the first fin structure 110. Specifically, each first gate structure may include a first gate dielectric layer 114 formed on the portion of the top and the sidewall surfaces of the corresponding first fin structure 110 and a first gate electrode layer 116 formed on the first gate dielectric layer 114. The second gate structure may be formed across the corresponding second fin structure 120 and may cover a portion of the top and the sidewall surfaces of the second fin structure 120. Specifically, each second gate structure may include a second gate oxide layer 121 formed on the portion of the top and the sidewall surfaces of the corresponding second fin structure 120, a second gate dielectric layer 124 formed on the second gate oxide layer 121, and a second gate electrode layer 126 formed on the second gate dielectric layer 124.

For devices in the core region I, the first gate dielectric layer 114 may serve as the gate dielectric layer. However, for devices in the peripheral region II, the second gate oxide layer 121 together with the second gate dielectric layer 124 may serve as the gate dielectric layer. In one embodiment, the first gate dielectric layer 114 may be made of a high-k dielectric material; while the second gate dielectric layer 124 may also be made of a high-k dielectric material. The high-k dielectric material may refer to a material with a relative dielectric constant greater than the relative dielectric constant of $SiO_2$. Such a high-k material may be $HfO_2$, HfSiO, HfSiON, HfTaO, HfTiO, HfZrO, $ZrO_2$, or $Al_2O_3$.

The metal layer may be made of Al, Cu, Ag, Au, Pt, Ni, Ti, or W. In one embodiment, the metal layer is made of W. Accordingly, the first gate electrode layer 116 is made of W, while the second gate electrode layer 126 is also made of W.

In one embodiment, after forming the gate dielectric layer on the surface of each first fin structure 110 and each second fin structure 120 but prior to forming the metal layer, the process to form the first gate structure and the second gate structure may further include forming a work function layer (not shown) on the surface of the gate dielectric layer.

Accordingly, as shown in FIG. 10, each first gate structure may also include a first work function layer 115 formed between the first gate dielectric layer 114 and the first gate electrode layer 116. The first work function layer 115 may be formed to tune the threshold voltage of the devices in the core region I. Similarly, each second gate structure may also include a second work function layer 125 formed between the second gate dielectric layer 124 and the second gate electrode layer 126. The second work function layer 125 may be formed to tune the threshold voltage of the devices in the peripheral region II.

In one embodiment, when the core region I and the peripheral region II both include N-type regions, the first work function layer 115 and the second work function layer 125 may be made of an N-type work function material. When the core region I and the peripheral region II both include P-type regions, the first work function layer 115 and the second work function layer 125 may be made of a P-type work function material.

Specifically, when the core region I and the peripheral region II both include N-type regions, an N-type work function material may be used to form the first work function layer 115 and the second work function layer 125. The work function of the N-type work function material may be in a range of 3.9 eV to 4.5 eV. For example, the work function of the N-type work function material may be 4.0 eV, 4.1 eV, or 4.3 eV. The first work function layer 115 may have a single-layer structure or a multiple-layer structure. The material used to form the first work function layer 115 may include one or more of TiAl, TaAlN, TiAlN, MoN, TaCN, etc. The second work function layer 125 may also have a single-layer structure or a multiple-layer structure. The material used to form the second work function layer 125 may include one or more of TiAl, TaAlN, TiAlN, MoN, TaCN, AlN, etc. In one embodiment, the first work function layer 115 may be made of TiAl, while the second work function layer may also be made of TiAl.

Alternatively, when the core region I and the peripheral region II both include P-type regions, a P-type work function material may be used to form the first work function layer 115 and the second work function layer 125. The work function of the P-type work function material may be in a range of 5.1 eV to 5.5 eV. For example, the work function of the N-type to work function material may be 5.2 eV, 5.3 eV, or 5.4 eV. The first work function layer 115 may have a single-layer structure or a multiple-layer structure. The material used to form the first work function layer 115 may include one or more of Ta, TiN, TaN, TaSiN, TiSiN, etc. The second work function layer 125 may also have a single-layer structure or a multiple-layer structure. The material used to form the second work function layer 125 may include one or more of Ta, TiN, TaN, TaSiN, TiSiN, etc. In one embodiment, the first work function layer 115 may be made of TiN, while the second work function layer may also be made of TiN.

In one embodiment, the first gate structure and the second gate structure may be formed by a process including the following steps. First, a gate dielectric layer (not shown) may be formed on the surface of each first fin structure 110, the surface of each second gate oxide layer 121, the surface of the isolation layer 102, and the top and the sidewall surfaces of the dielectric layer 104. Further, a work function layer (not shown) may be formed on the surface of the gate dielectric layer, and a metal layer (not shown) may then be formed on the surface of the work functional layer. The top surface of the metal layer may be higher than the top surface of the dielectric layer 104. Moreover, the portion of the metal layer formed above the dielectric layer 104 may be removed by a polishing process such that a first gate electrode layer 116 may be formed on the surface of each work function layer in the core region I and a second gate electrode layer 126 may be formed on the surface of each work function layer in the peripheral region II.

Moreover, during the polishing process to remove the top portion of the metal layer formed above the top surface of the dielectric layer 104, the portion of the gate dielectric layer and the portion of the work function layer formed above the top surface of the dielectric layer 104 may also be removed. As such, a first gate dielectric layer 114 may be formed in the core region I on the surface of each first fin structure 110, the surface of the isolation layer 102, and the sidewall surfaces of the dielectric layer 104, while a first work function layer 115 may be formed on the surface of the first gate dielectric layer 114. In addition, a second gate dielectric layer 124 may be formed in the peripheral region II on the surface of second oxide layer 121, the surface of the isolation layer 102, and the sidewall surfaces of the dielectric layer 104, while a second work function layer 125 may be formed on the surface of the second gate dielectric layer 124.

Further, in order to improve the properties at the interfaces between each first gate structure and the corresponding first fin structure 110 and between each second gate structure and the corresponding second fin structure 120, the fabrication method may further include the following steps before forming the first gate dielectric layer 114 and the second dielectric layer 124. First, a first interface layer 113 as shown in FIG. 10 may be formed on the surface of each first fin structure 110. The first interface layer 113 may be formed across the corresponding first fin structure 110 and covering a portion of the top and the sidewall surfaces of the first fin structure 110. Further, a second interface layer 123 may be formed on the surface of each second fin structure 120. The second interface layer 123 may be formed across the corresponding second fin structure 120 and covering a portion of the top and sidewall surfaces of the second fin structure 120.

According to the disclosed fabrication method, a first dummy gate structure may be initially formed on the surface of each first fin structure and a second dummy gate structure may also be initially formed on the surface of each second fin structure. The first dummy gate structure may include a first dummy gate oxide layer and a first dummy gate electrode layer, while the second dummy gate structure may include a second gate oxide layer and a second dummy gate electrode layer. Further, after removing the first dummy gate structures initially formed in the core region, an ion implantation process may be performed on the first fin structures to tune the threshold voltages of the devices in the core region.

Traditionally, a thermal oxidation process may be used to form the first dummy gate oxide layer and the second gate oxide layer. However, such a thermal oxidation process may easily cause loss of the implanted ions. According to the disclosed fabrication method, the ion implantation process to tune the threshold voltages may be performed after the thermal oxidation process to form the first dummy gate oxide layer and the second gate oxide layer. Therefore, the disclosed method may be able to avoid loss of implanted ions due to the thermal oxidation process, and thus the stability of the electrical performance of the devices in the core region may be ensured.

Further, the ion implantation process to tune the threshold voltages for the first fin structures may include four steps: a first N-type ion implantation process to tune the threshold voltages for the first N-type fin structure, a second N-type ion implantation process to tune the threshold voltages for the second N-type fin structure, a first P-type ion implantation process to tune the threshold voltages for the first P-type fin structure, and a second P-type ion implantation process to tune the threshold voltages for the second P-type fin structure. Accordingly, four removal processes may be required to remove the four patterned layers used in the four implantation steps. Therefore, the second dummy gate electrode layer may be removed after implanting ions into all first fin structures to tune the threshold voltages. During the ion implantation process to tune the threshold voltages for the first fin structures, the second dummy gate electrode layer may provide protection for the surfaces of the corresponding second fin structure and the corresponding second gate oxide layer. Specifically, the etching process to remove each of the four patterned layers may not consume the second gate oxide layer, and thus the stability of the electrical performance of the devices in the peripheral region may be ensured.

The present disclosure also provides a semiconductor structure. FIG. 10 shows a schematic cross-section view of an exemplary semiconductor structure consistent with the disclosed embodiments.

Referring to FIG. 10, the semiconductor structure may include a semiconductor base structure. The semiconductor base structure may include a substrate 100 and a plurality of fin structures formed on the substrate 100. The substrate 100 may further include a core region I and a peripheral region II. Fin structures formed in the core region I are first fin structures 110 while fin structures formed in the peripheral region II are second fin structures 120. For illustration purposes, FIG. 10 only shows one first fin structure 110 formed on the substrate of one core region I and one second fin structure 120 formed on the substrate of one peripheral region II, although the number of the first fin structures 110 formed in the core region I and/or the number of the second fin structures 120 formed in the peripheral region II may be more than one.

Moreover, the core region I may include at least one N-type region and/or at least one P-type region, and the peripheral region II may include at least one N-type region and/or at least one P-type region. That is, the core region I and the peripheral region II may include same type and/or different type MOS structures. In one embodiment, MOS structures in the core region I may be the same type as MOS structures in the peripheral region II.

The semiconductor structure may also include an isolation layer 102 formed on the substrate 100 between neighboring fin structures. The isolation layer 102 may cover a portion of the sidewall surfaces of the fin structures and the top surface of the isolation layer 102 may be lower than the top surfaces of the fin structures.

The semiconductor structure may further include a first gate structure formed on a portion of the top and the sidewall surfaces of each first fin structure 110 and a second gate structure formed on a portion of the top and the sidewall surfaces of each second fin structure 120. Each first gate structure may include a first gate dielectric layer 114 formed on a portion of the top and sidewall surfaces of the corresponding first fin structure 110, and a first gate electrode layer 116 formed on the first gate dielectric layer 114. Each second gate structure may include a second oxide layer 121 formed on a portion of the top and the sidewall surfaces of the corresponding second fin structure 120, a second gate dielectric layer 124 formed on the second oxide layer 121, and a second gate electrode layer 126.

The first gate structure in the core region I may be formed after removing a first dummy gate structure previously formed on the corresponding first fin structure 110. The second gate structure in the peripheral region II may be completed after removing a second gate structure previously formed on the corresponding second fin structure 120, and then forming a second oxide layer 121 on the exposed portion of the top and the sidewall surfaces of the second fin structure 120.

The first gate structure may also include an interface layer 113 formed between the first fin structure 110 and the first gate dielectric layer 114, and the second gate structure may also include an interface layer 123 formed between the second gate oxide layer 121 and the second gate dielectric layer 124.

Moreover, the first gate structure may include a first work-function layer 115 formed between the first gate dielectric layer 114 and the first gate electrode layer 116. The second gate structure may also include a second work-function layer 125 formed between the second gate dielectric layer 124 and the second gate electrode layer 116.

Compared to existing semiconductor structures and fabrication methods, the disclosed semiconductor structures and fabrication methods may demonstrates several advantages.

According to the disclosed semiconductor structures and fabrication methods, a first dummy gate structure may be formed on the surface of each first fin structure and a second dummy gate structure may also be formed on the surface of each second fin structure. The first dummy gate structure may include a first dummy gate oxide layer and a first dummy gate electrode layer, while the second dummy gate structure may include a second gate oxide layer and a second dummy gate electrode layer. Further, after removing the first dummy gate structures previously formed in the core region, an ion implantation process may be performed on the first fin structures to tune the threshold voltages of the devices in the core region.

Traditionally, a thermal oxidation process may be used to form the first dummy gate oxide layer and the second gate oxide layer. However, such a thermal oxidation process may easily cause loss of the implanted ions. According to the disclosed fabrication method, the ion implantation process to tune the threshold voltages may be performed after the thermal oxidation process to form the first dummy gate oxide layer and the second gate oxide layer. Therefore, the disclosed structures and methods may be able to avoid loss of implanted ions due to the thermal oxidation process, and thus the stability of the electrical performance of the devices in the core region may be ensured.

Further, the ion implantation process to tune the threshold voltages for the first fin structures may include four steps: a first N-type ion implantation process to tune the threshold voltages for the first N-type fin structure, a second N-type ion implantation process to tune the threshold voltages for the second N-type fin structure, a first P-type ion implantation process to tune the threshold voltages for the first P-type fin structure, and a second P-type ion implantation process to tune the threshold voltages for the second P-type fin structure. Accordingly, four removal processes may be required to remove the four patterned layers used in the four implantation steps. Therefore, the second dummy gate electrode layer may be removed after implanting ions into all first fin structures to tune the threshold voltages. During the ion implantation process to tune the threshold voltages for the first fin structures, the second dummy gate electrode layer may provide protection for the surfaces of the corresponding second fin structure and the corresponding second gate oxide layer. Specifically, the etching process to remove each of the four patterned layers may not consume the second gate oxide layer, and thus the stability of the electrical performance of the devices in the peripheral region may be ensured.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
    forming a plurality of fin structures on a substrate including a core region and a peripheral region, wherein the plurality of fin structures include first fin structures formed in the core region and second fin structures formed in the peripheral region;
    forming a first dummy gate structure on each first fin structure and a second dummy gate structure on each second fin structure, wherein each first fin structure includes a first dummy gate oxide layer and a first dummy gate electrode layer, and each second fin structure includes a second gate oxide layer and a second dummy gate electrode layer, wherein:
        the first fin structures include at least one first N-type fin structure, at least one second N-type fin structure, at least one first P-type fin structure, and at least one second P-type fin structure;
        forming a dielectric layer on the structure having a top surface leveled with top surfaces of the first dummy gate structures and the second dummy gate structures;
        removing each first dummy gate electrode layer to expose each first dummy gate oxide layer;
        performing an ion implantation process on the first fin structures through each first dummy gate oxide layer to tune corresponding threshold voltages, each first dummy gate oxide layer being exposed after removing each first dummy gate electrode layer, wherein the ion implantation process performed on the first fin structures to tune the threshold voltages further includes: a first N-type ion implantation to tune the threshold voltage of the at least one first N-type fin structure, a second N-type ion implantation to tune the threshold voltage of the at least one second N-type fin structure, a first P-type ion implantation to tune the threshold voltage of the at least one first P-type fin structure, and a second P-type ion implantation to tune the threshold voltage of the at least one second P-type fin structure, wherein:
        a dosage of ions implanted into the at least one second N-type fin structure during the second N-type ion implantation is different from a dosage of ions implanted into the at least one first N-type fin structure during the first N-type ion implantation process; and
        a dosage of ions implanted into the at least one second P-type fin structure during the second P-type ion implantation is different from a dosage of ions implanted into the at least one first P-type fin structure during the first P-type ion implantation process;
    removing each first dummy gate oxide layer;
    removing each second dummy gate electrode layer to expose each second gate oxide layer;
    forming a gate dielectric layer on each first fin structure and on each second gate oxide layer; and
    forming a metal layer to on the gate dielectric layer.

2. The method for fabricating the semiconductor structure according to claim 1, wherein N-type ions are implanted into the first fin structures during the ion implantation process, and process parameters of the ion implantation process include:
    using arsenic ions as the N-type ions;
    an energy of implanted N-type ions in a range of 5 keV to 12 keV; and
    a dosage of implanted N-type ions in a range of 1E12 atom/cm$^2$ to 5E13 atom/cm$^2$.

3. The method for fabricating the semiconductor structure according to claim 1, wherein P-type ions are implanted into the first fin structures during the ion implantation process, and process parameters of the ion implantation process include:
    using $BF_2^+$ ions as the P-type ions;
    an energy of implanted P-type ions in a range of 3 keV to 10 keV; and
    a dosage of implanted P-type ions in a range of 5E12 atom/cm$^2$ to 5E14 atom/cm$^2$.

4. The method for fabricating the semiconductor structure according to claim 1, wherein removing each second dummy gate electrode layer further includes:
    forming a deep ultraviolet-light-absorbing oxide (DUO) layer to cover each first fin structure and expose a top surface of each second dummy gate electrode layer;
    removing each second dummy gate electrode layer using the DUO layer as an etch mask until a top surface of the corresponding second gate oxide layer is exposed; and
    removing the DUO layer.

5. The method for fabricating the semiconductor structure according to claim 1, wherein:
    the gate dielectric layer formed on each first fin structure and on each second gate oxide layer also covers top and sidewall surfaces of the dielectric layer;
    a work function layer is formed on the gate dielectric layer;
    the metal layer is formed on a surface of the work function layer, wherein a top surface of the metal layer is higher than the top surface of the dielectric layer; and
    a portion of the metal layer formed above the top surface of the dielectric layer is removed by polishing to form a first gate electrode layer on the surface of each work function layer in the core-region and a second gate electrode layer on the surface of each work function layer in the peripheral region.

6. The method for fabricating the semiconductor structure according to claim 5, wherein during the polishing process to remove the portion of the metal layer formed above the top surface of the dielectric layer, further including:
removing a portion of the gate dielectric layer and a portion of the work function layer formed above the top surface of the dielectric layer to form:
a first gate dielectric layer on each first fin structure and sidewall surfaces of the dielectric layer;
a first work function layer on the first gate dielectric layer;
a second gate dielectric layer on each second gate oxide layer and also on sidewall surfaces of the dielectric layer; and
a second work function layer on the second gate dielectric layer.

7. The method for fabricating the semiconductor structure according to claim 1, wherein the metal layer is made of one of Al, Cu, Ag, Au, Pt, Ni, Ti, and W.

8. The method for fabricating the semiconductor structure according to claim 1, wherein:
a portion of the gate dielectric layer and a portion of the metal layer formed on each first fin structure in the core region form a first gate structure, and
a second gate oxide layer, a portion of the gate dielectric layer, and a portion of the metal layer formed on each second fin structure in the peripheral region form a second gate structure.

9. The method for fabricating the semiconductor structure according to claim 1, wherein the first dummy gate oxide layer and the second gate oxide layer are fabricated by a thermal oxidation process.

10. The method for fabricating the semiconductor structure according to claim 9, wherein the first dummy gate oxide layer and the second gate oxide layer are formed by an in-situ steam generation (ISSG) oxidation process, and process parameters used in the ISSG oxidation process include:
a process gas including $O_2$ and $H_2$;
a flow rate of 02 in a range of 1 sccm to 30 sccm;
a flow rate of $H_2$ in a range of 1.5 sccm to 15 sccm; and
a chamber temperature in a range of 700° C. to 1200° C.

11. The method for fabricating the semiconductor structure according to claim 1, wherein the gate dielectric layer is made of one of $HfO_2$, HfSiO, HfSiON, HfTaO, HfTiO, HfZrO, $ZrO_2$, and $Al_2O_3$.

12. The method for fabricating the semiconductor structure according to claim 1, wherein:
the core region is an N-type region or a P-type region;
the peripheral region is an N-type region or a P-type region; and
the core region and the peripheral region have a same type.

13. The method for fabricating the semiconductor structure according to claim 12, wherein:
after forming the gate dielectric layer on the first fin structures and the second gate oxide layers, and prior to forming the metal layer on the gate dielectric layer, a work function layer is formed on the gate dielectric layer;
when the core region and the peripheral region both include N-type regions, the work function layer is made of an N-type work function material; and
when the core region and the peripheral region both include P-type regions, the work function layer is made of a P-type work function material.

14. The method for fabricating the semiconductor structure according to claim 13, wherein:

the N-type work function material is one or more of TiAl, TaAlN, TiAlN, MoN, TaCN, and AlN; and
the P-type work function material is one or more of Ta, TiN, TaN, TaSiN, and TiSiN.

15. The method for fabricating the semiconductor structure according to claim 1, wherein removing each first dummy gate electrode layer further includes:
forming a photoresist layer to cover each second dummy gate electrode layer and expose a top surface of each first dummy gate electrode layer;
removing each first dummy gate electrode layer using the photoresist layer as an etch mask; and
removing the photoresist layer.

16. A method for fabricating a semiconductor structure, comprising:
forming a plurality of fin structures on a substrate including a core region and a peripheral region, wherein the plurality of fin structures include first fin structures formed in the core region and second fin structures formed in the peripheral region;
forming a first dummy gate structure on each first fin structure and a second dummy gate structure on each second fin structure, wherein each first fin structure includes a first dummy gate oxide layer and a first dummy gate electrode layer, and each second fin structure includes a second gate oxide layer and a second dummy gate electrode layer;
forming a dielectric layer on the structure having a top surface leveled with top surfaces of the first dummy gate structures and the second dummy gate structures, wherein:
after forming the first dummy gate structure on each first fin structure and the second dummy gate structure on each second fin structure, and prior to forming the dielectric layer, the fabrication method also includes:
forming a core-region stress layer in the first fin structure on each side of the first dummy gate structure and a second peripheral-region stress layer in the second fin structure on each side of the second dummy gate structure; and
forming a core-region source/drain in the core-region stress layer on each side of the first dummy gate structure and forming a core-region source/drain in the peripheral-region stress layer on each side of the second dummy gate structure;
removing each first dummy gate electrode layer to expose each first dummy gate oxide layer;
performing an ion implantation process on the first fin structures through each first dummy gate oxide layer to tune corresponding threshold voltages;
removing each first dummy gate oxide layer;
removing each second dummy gate electrode layer to expose each second gate oxide layer;
forming a gate dielectric layer on each first fin structure and on each second gate oxide layer; and
forming a metal layer to on the gate dielectric layer.

17. The method for fabricating the semiconductor structure according to claim 16, wherein:
a portion of the gate dielectric layer and a portion of the metal layer formed on each first fin structure in the core region form a first gate structure, and
a second gate oxide layer, a portion of the gate dielectric layer, and a portion of the metal layer formed on each second fin structure in the peripheral region form a second gate structure.

18. The method for fabricating the semiconductor structure according to claim 16, wherein removing each first dummy gate electrode layer further includes:
- forming a photoresist layer to cover each second dummy gate electrode layer and expose a top surface of each first dummy gate electrode layer;
- removing each first dummy gate electrode layer using the photoresist layer as an etch mask; and
- removing the photoresist layer.

19. The method for fabricating the semiconductor structure according to claim 16, wherein removing each second dummy gate electrode layer further includes:
- forming a deep ultraviolet-light-absorbing oxide (DUO) layer to cover each first fin structure and expose a top surface of each second dummy gate electrode layer;
- removing each second dummy gate electrode layer using the DUO layer as an etch mask until a top surface of the corresponding second gate oxide layer is exposed; and
- removing the DUO layer.

* * * * *